US011152933B2

United States Patent
Matsubara (10) Patent No.: US 11,152,933 B2
(45) Date of Patent: Oct. 19, 2021

(54) GATE DRIVER AND POWER CONVERTER

(71) Applicant: FUJI ELECTRIC CO., LTD., Kanagawa (JP)

(72) Inventor: Kunio Matsubara, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/029,523

(22) Filed: Sep. 23, 2020

(65) Prior Publication Data
US 2021/0143812 A1 May 13, 2021

(30) Foreign Application Priority Data

Nov. 13, 2019 (JP) .............................. JP2019-205284

(51) Int. Cl.
| H02M 1/08 | (2006.01) |
| H03K 17/0412 | (2006.01) |
| H02M 1/00 | (2006.01) |
| H03K 17/16 | (2006.01) |
| H03K 17/687 | (2006.01) |

(52) U.S. Cl.
CPC .............. *H03K 17/16* (2013.01); *H02M 1/08* (2013.01); *H03K 17/687* (2013.01)

(58) Field of Classification Search
None
See application file for complete search history.

(56) References Cited

U.S. PATENT DOCUMENTS

| 2014/0091850 A1 | 4/2014 | Kohama et al. |
| 2015/0311692 A1 | 10/2015 | Hiyama |
| 2020/0021282 A1 | 1/2020 | Yamamoto et al. |
| 2021/0013792 A1* | 1/2021 | Matsubara ............ H02M 3/158 |

FOREIGN PATENT DOCUMENTS

JP  4935266  5/2012

OTHER PUBLICATIONS

Office Action dated Dec. 31, 2020 issued with respect to the related U.S. Appl. No. 16/797,202.

* cited by examiner

*Primary Examiner* — Kenneth B Wells
(74) *Attorney, Agent, or Firm* — IPUSA, PLLC (57) ABSTRACT

A gate driver includes: a drive circuit configured to drive, in accordance with an input signal that commands to turn on/off a switching element connected between high and low power supply potential parts, a gate of the switching element; a time storage circuit configured to store a time length from when the input signal is switched to an on command to when a recovery surge voltage generated by a diode that is opposite to the switching element is detected; a switching determination circuit configured to determine, in accordance with a detected value of a power supply voltage, whether to switch a gate driving condition; and a driving condition change circuit configured to change, in accordance with a determination result of the switching determination circuit, the gate driving condition at a time of current turn-on by the time length stored at a time of previous turn-on.

11 Claims, 6 Drawing Sheets

GATE DRIVER AND POWER CONVERTER

CROSS-REFERENCE TO RELATED APPLICATION

This application is based upon and claims priority to Japanese Patent Application No. 2019-205284, filed on Nov. 13, 2019, the entire contents of which are incorporated herein by reference.

BACKGROUND OF THE INVENTION

1. Field of the Invention

The present invention relates to a gate driver and a power converter.

2. Description of the Related Art

Conventionally, in order to suppress a recovery surge voltage and switching losses, an active gate driving technique is known, in which the switching speed is changed at an appropriate timing in accordance with a drain current or a collector current (which may be referred to as a main current hereinafter) flowing through a switching element. For example, Patent Document 1 discloses a gate drive circuit that stores a surge period from a timing of a turn-on command to an occurrence timing of recovery surge voltage. At the time of current turn-on, the gate drive circuit determines a timing of changing effective gate resistance of the switching element, based on the surge period stored at the time of previous turn-on.

According to the description of Patent Document 1, in a surge period, the recovery surge voltage is reduced by increasing the effective gate resistance value, and after the lapse of the surge period, the switching speed is increased by reducing the effective gate resistance value, so that the switching losses can be reduced. Also, according to the description of Patent Document 1, because the effective gate resistance at the time of turn-on is changed by using information at time of previous turn-on, a time margin required for feedback control can be secured.

RELATED-ART DOCUMENTS

Patent Document

[Patent Document 1] Japanese Patent No. 4935266

Figure 1:
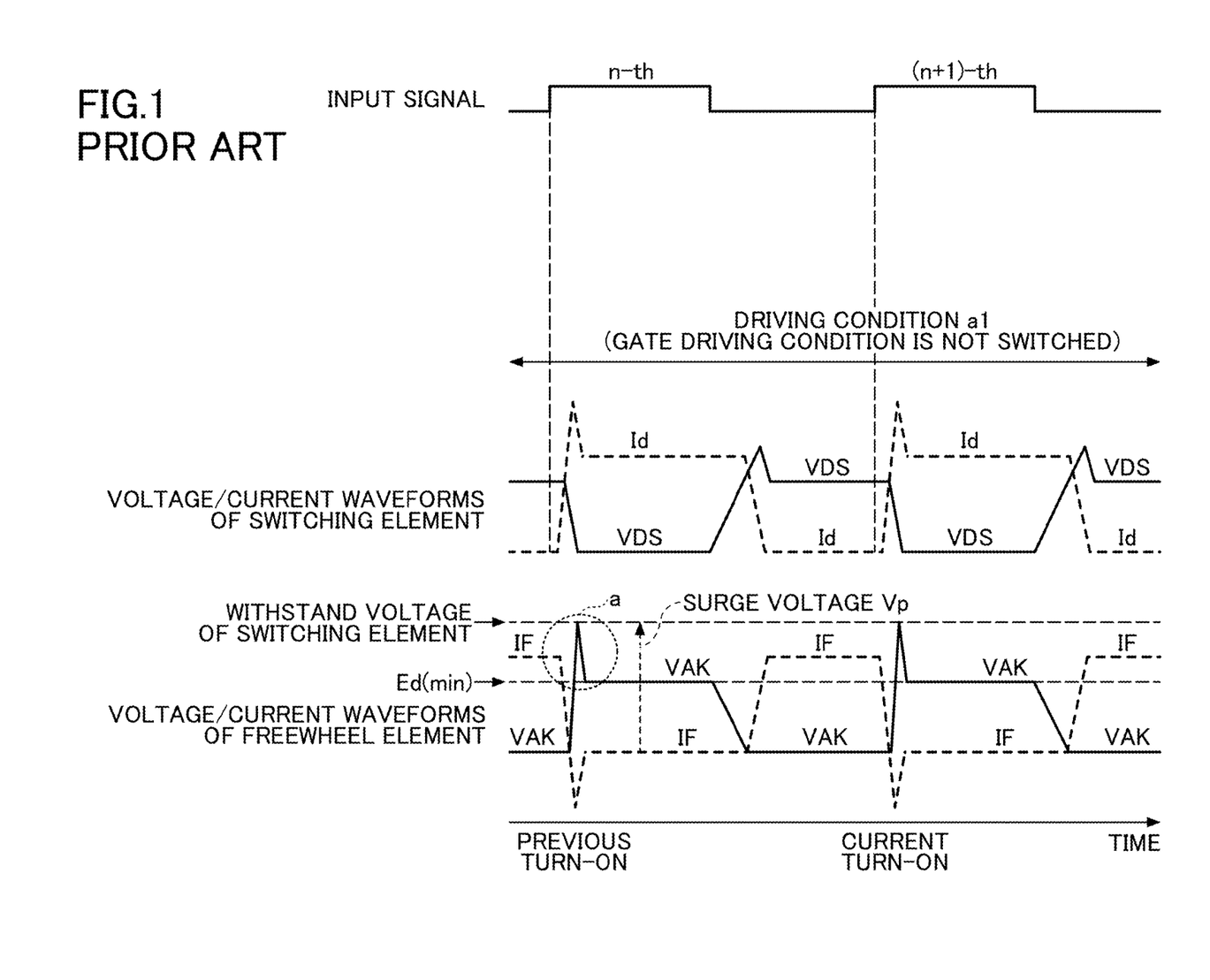
FIG. 1 is a timing chart in a case in which a surge suppression technique is not applied.

FIG. 1 illustrates, as an example, an input signal that commands to turn on/off a switching element that is connected between a high power supply potential part and a low power supply potential part, voltage/current waveforms of the switching element, and voltage/current waveforms of a freewheel element that is opposite to the switch element. Id indicates a drain current flowing through the switching element, VDS indicates a voltage between the drain and source of the switching element, IF indicates a forward current flowing through the freewheel element that is opposite to the switching element, and VAK indicates a voltage between the anode and the cathode of the freewheel element that is opposite to the switching element.

A power supply voltage that is supplied from a direct current (DC) power supply (power supply voltage between the high power supply potential part and the low power supply potential part) varies to a certain extent due to a change in input voltage of the DC power supply or some other reason. Therefore, in a case in which the gate of the switch element that is connected between the high power supply potential part and the low power supply potential part is driven, even being turned on at the maximum power supply voltage, it is required that the recovery surge voltage does not exceed a withstand voltage of the switching element connected in parallel with a freewheel element.

Therefore, as illustrated in FIG. 1, for example, in a situation in which the power supply voltage is reduced to the minimum value Ed(min), even when a gate driving condition is not switched to a condition in which the gate resistance value is increased, it is considered that the peak value Vp of the recovery surge voltage does not exceed withstand voltage (element withstand voltage) of the switching element (refer to circle a).

Figure 2:
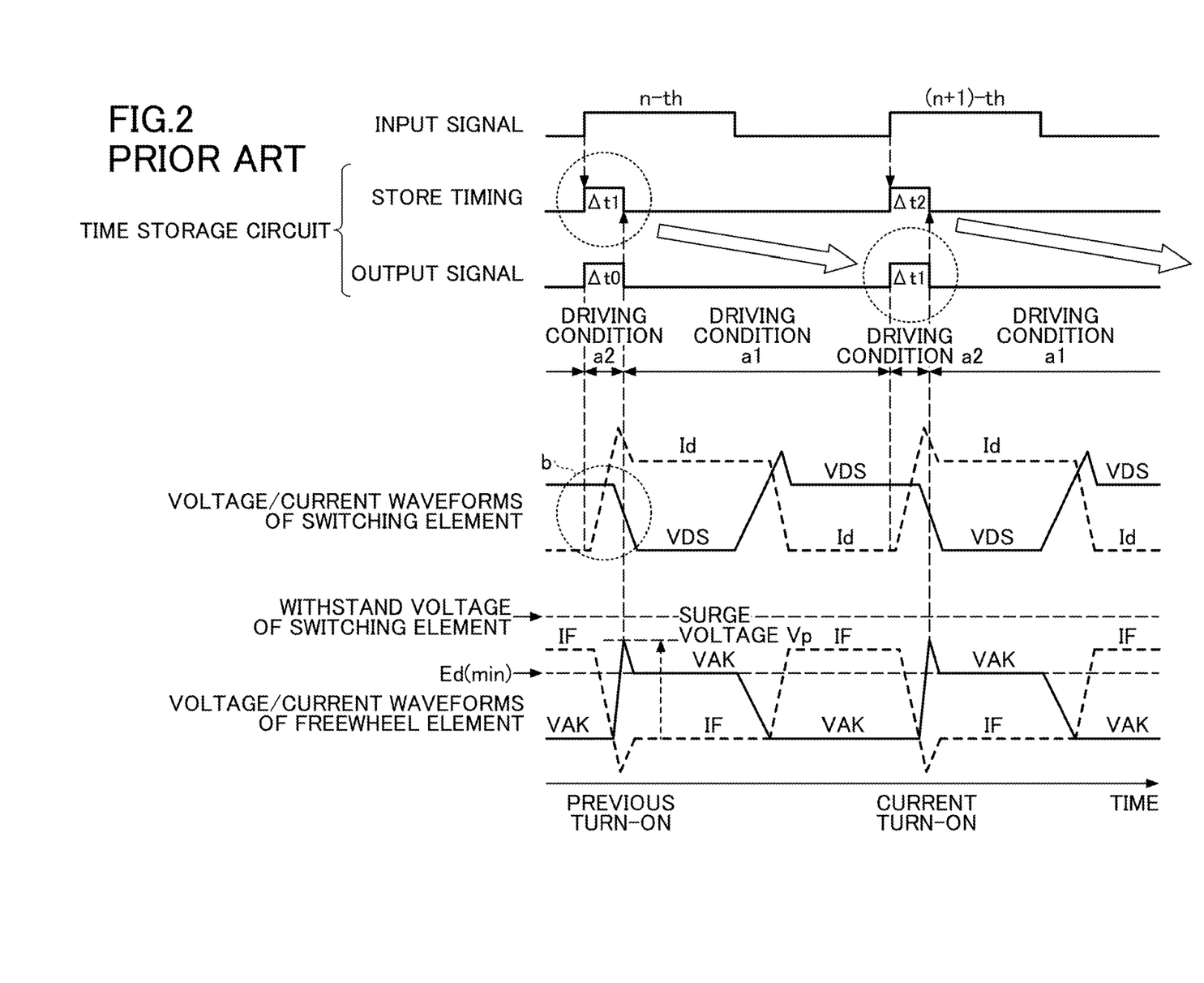
FIG. 2 is a timing chart in a case in which a surge suppression technique is applied.

However, in the related art technique of increasing the gate resistance value at each turn-on time (reverse recovery time) to suppress the recovery surge voltage, a change rate (dI/dt) of the main current Id with respect to time is always gentle at each turn-on time, as illustrated in FIG. 2. Therefore, in a situation in which the power supply voltage is lowered relative to the maximum value, switching losses at the time of turn-on increase compared to a case such as FIG. 1 in which the gate driving condition is not switched. As a result, for example, there is a risk that power conversion efficiency may decrease or a size of a cooling element for cooling the switching element may become larger.

The present disclosure provides a gate driver and a power converter that enable to achieve both suppression of recovery surge voltage and reduction of switching losses even when a power supply voltage varies.

SUMMARY OF THE INVENTION

The present disclosure provides a gate driver including:
a drive circuit configured to drive, in accordance with an input signal that commands to turn on/off a switching element that is connected between a high power supply potential part and a low power supply potential part, a gate of the switching element;
a time storage circuit configured to store a time length from when the input signal is switched to an on command to when a recovery surge voltage that is generated by a diode that is opposite to the switching element is detected;
a switching determination circuit configured to determine, in accordance with a detected value of a power supply voltage between the high power supply potential part and the low power supply potential part, whether or not to switch a gate driving condition of the switching element; and
a driving condition change circuit configured to change, in accordance with a determination result of the switching determination circuit, the gate driving condition at a time of current turn-on by a time length that is the same as the time length stored at a time of previous turn-on in the time storage circuit.

The present disclosure provides a power converter:
a plurality of switching elements that are connected in series between a high power supply potential part and a low power supply potential part;
a plurality of gate drives provided for the plurality of respective switching elements and each of which is configured to drive a gate of a corresponding one switching element of the plurality of switching elements; and
a power supply voltage detection circuit configured to detect a power supply voltage between the high power supply potential part and the low power supply potential part;
each of the plurality of gate drives includes:

a drive circuit configured to drive, in accordance with an input signal that commands to turn on/off the corresponding one switching element, the gate of the corresponding one switching element;

a time storage circuit configured to store a time length from when the input signal is switched to an on command to when a recovery surge voltage that is generated by a diode that is opposite to the corresponding one switching element is detected;

a switching determination circuit configured to determine, in accordance with the power supply voltage detected by the power supply voltage detection circuit, whether or not to switch a gate driving condition of the corresponding one switching element; and a driving condition change circuit configured to change, in accordance with a determination result of the switching determination circuit, the gate driving condition at a time of current turn-on by a time length that is the same as the time length stored at a time of previous turn-on in the time storage circuit.

According to the present disclosure, it is possible to provide a gate driver and a power converter that enable to achieve both suppression of recovery surge voltage and reduction of switching losses even when a power supply voltage varies.

DETAILED DESCRIPTION OF THE EMBODIMENTS

In the following, an embodiment according to the present disclosure will be described with reference to the drawings.

Figure 3:
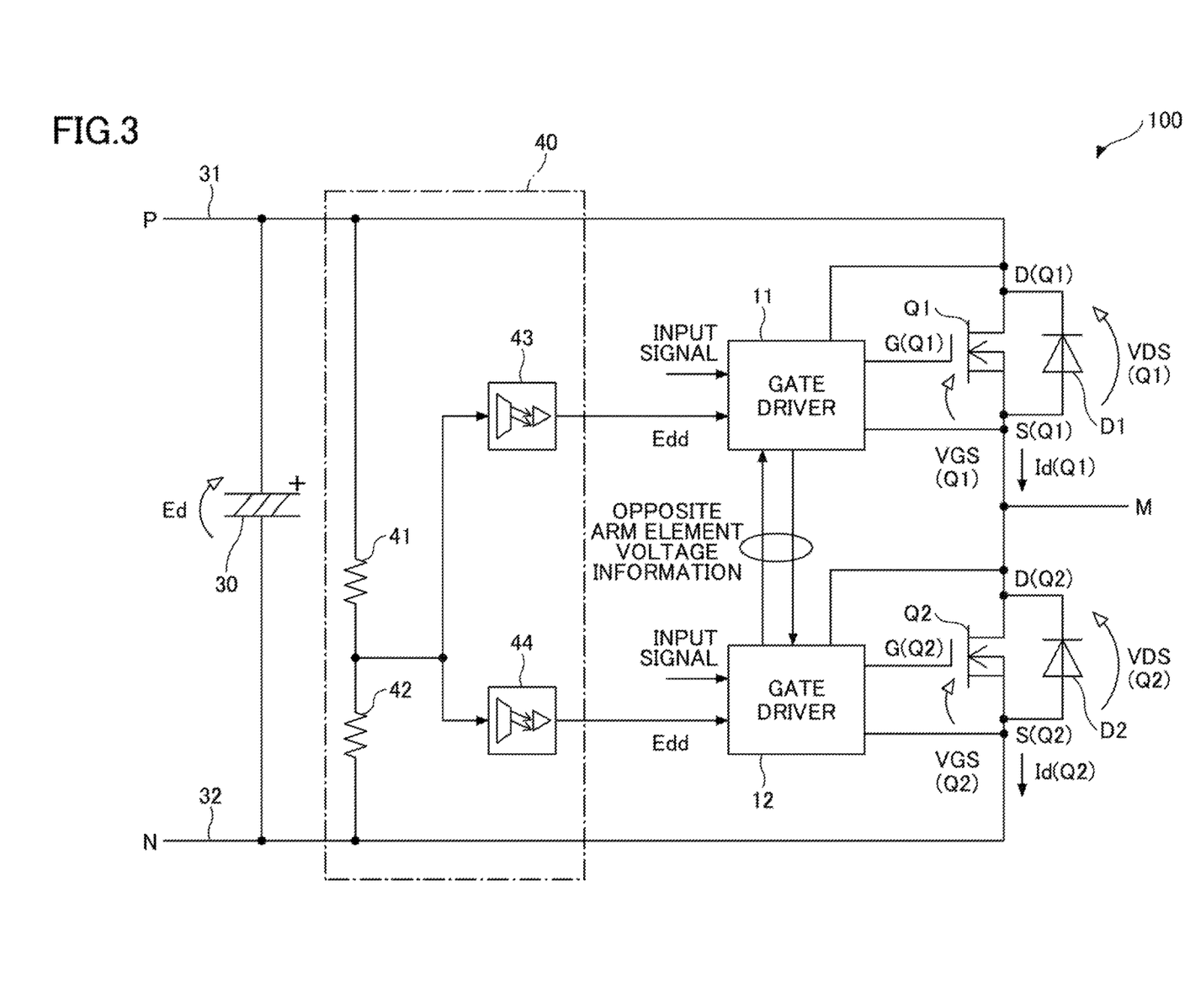
FIG. 3 is a circuit diagram illustrating a configuration example of a power converter.

FIG. 3 is a diagram illustrating an example of a configuration of a power converter 100. The power converter 100 illustrated in FIG. 3 is a device that converts DC input power to a desired DC or AC output power using a high-side switching element Q1 and a low-side switching element Q2. A load (not illustrated) is connected to a connection point M between the switching element Q1 and the switching element Q2. The power converter 100 includes a high power supply potential part 31, a low power supply potential part 32, a capacitor 30, the switching elements Q1 and Q2, a power supply voltage detection circuit 40, and gate drivers 11 and 12.

The high power supply potential part 31 and the low power supply potential part 32 are electrically conductive parts that are connected to a DC power supply (not illustrated) and are supplied with DC power from the DC power supply. The positive electrode P side of the DC power supply is connected with the high power supply potential part 31, and the negative electrode N side of the DC power supply is connected with the low power supply potential part 32. Examples of the DC power supply include a rectifier circuit, a converter, and a regulator. The low power supply potential part 32 is a part having a lower electric potential than that of the high power supply potential part 31. Power supply voltage Ed of DC is generated between the high power supply potential part 31 and the low power supply potential part 32.

The capacitor 30 is a capacitive element that smoothes the power supply voltage Ed. An example of the capacitor 30 includes an electrolytic capacitor. The capacitor 30 has one end that is connected to the high power supply potential part 31 and the other end that is connected to the low power supply potential part 32.

Each of the switching elements Q1 and Q2 is a voltage driven semiconductor device and includes a control electrode (gate), a first main electrode (collector or drain), and a second main electrode (emitter or source). Specific examples of the switching elements Q1 and Q2 include a metal oxide semiconductor field effect transistor (MOSFET), an insulated gate bipolar transistor (IGBT), and the like. FIG. 3 illustrates a case in which each of the switching elements Q1 and Q2 is an N-channel MOSFET including a gate G, a drain D, and a source S.

The switching elements Q1 and Q2 are connected in series with each other. The switching element Q1 is connected between the high power supply potential part 31 and the low power supply potential part 32, and is connected to the low power supply potential part 32 via the switching element Q2. The switching element Q2 is connected between the high power supply potential part 31 and the low power supply potential part 32, and is connected to the high power supply potential part 31 via the switching element Q1. The switching element Q1 includes the gate G that is connected to the gate driver 11, the drain D that is connected to the high power supply potential part 31, and the source S that is connected to the drain D of the switching element Q2. The switching element Q2 includes the gate G that is connected to the gate driver 12, the source S that is connected to the low power supply potential part 32, and the drain D that is connected to the source S of the switching element Q1. For the switching element Q1, a diode D1 is connected in antiparallel between the drain D and the source S. For the switching element Q2, a diode D2 is connected in antiparallel between the drain D and the source S.

It is preferable that the switching elements Q1 and Q2 are elements (wide-bandgap devices) each including a wide-bandgap semiconductor such as SiC (silicon carbide), GaN (gallium nitride), $Ga_2O_3$ (gallium oxide), or diamond. Applying wide-bandgap devices to the switching elements Q1 and Q2 enhances an effect of loss reduction of the switching elements Q1 and Q2. It should be noted that the switching elements Q1 and Q2 may be a switching element including a semiconductor such as Si (silicon). Similarly, applying wide-bandgap devices to the diodes D1 and D2 enhances an effect of loss reduction of the diodes D1 and D2. It should be noted that the diodes D1 and D2 may be an element including a semiconductor such as Si (silicon).

The power supply voltage detection circuit 40 detects the power supply voltage Ed between the high power supply potential part 31 and the low power supply potential part 32, and outputs a detected value Edd of the power supply voltage Ed to each of the gate drivers 11 and 12.

For example, the power supply voltage detection circuit 40 includes a voltage divider circuit formed of resistors 41 and 42, and isolation amplifiers 43 and 44 to which voltage divided by the voltage divider circuit is input. The voltage divider circuit divides the power supply voltage Ed by the resistors 41 and 42, and supplies the voltage obtained by dividing the power supply voltage Ed to each of the isolation amplifiers 43 and 44. Each of the isolation amplifiers 43 and 44 amplifies the voltage signal supplied from the voltage divider circuit and outputs a signal corresponding to the voltage value of the voltage signal as a detected value Edd of the power supply voltage Ed. The isolation amplifier 43 converts the power supply voltage Ed with the low power supply potential part 32 as a reference to the detected value Edd with the source S of the switching element Q1 as a reference, and the isolation amplifier 44 converts the power supply voltage Ed with the low power supply potential 32 as a reference to the detected value Edd of the source S of the switching element Q2 as a reference. Because respective inputs of the isolation amplifiers 43 and 44 are electrically isolated from respective outputs of the isolation amplifiers 43 and 44, common mode noise can be reduced.

The gate driver 11 is provided with respect to the switching element Q1 and drives the gate of the switching element Q1 that is corresponding one of the plurality of switching elements Q1 and Q2. The gate driver 12 is provided with respect to the switching element Q2 and drives the gate of the switching element Q2 that is corresponding one of the plurality of switching elements Q1 and Q2.

The gate driver 11 is a drive circuit that provides a positive or negative voltage to the gate of the switching element Q1 to turn on and turn off the switching element Q1. The gate driver 12 is a drive circuit that provides a positive or negative voltage to the gate of the switching element Q2 to turn on and turn off the switching element Q2. The gate driver 11 at the high-side drives the gate of the switching element Q1 using an active gate drive technique that adjusts the switching speed of the switching element Q1 during turn-on of the switching element Q1. The gate driver 12 at the low-side drives the gate of the switching element Q2 using the active gate drive technique that adjusts the switching speed of the switching element Q2 during turn-on of the switching element Q2. The gate driver 11 operates with the source S of the switching element Q1 as a ground reference, and the gate driver 12 operates with the source S of the switching element Q2 as a ground reference.

The gate drivers 11 and 12 have configurations that are the same as each other. Next, a configuration example of the gate driver 11 and 12 will be described with reference to FIG. 4.

Figure 4:
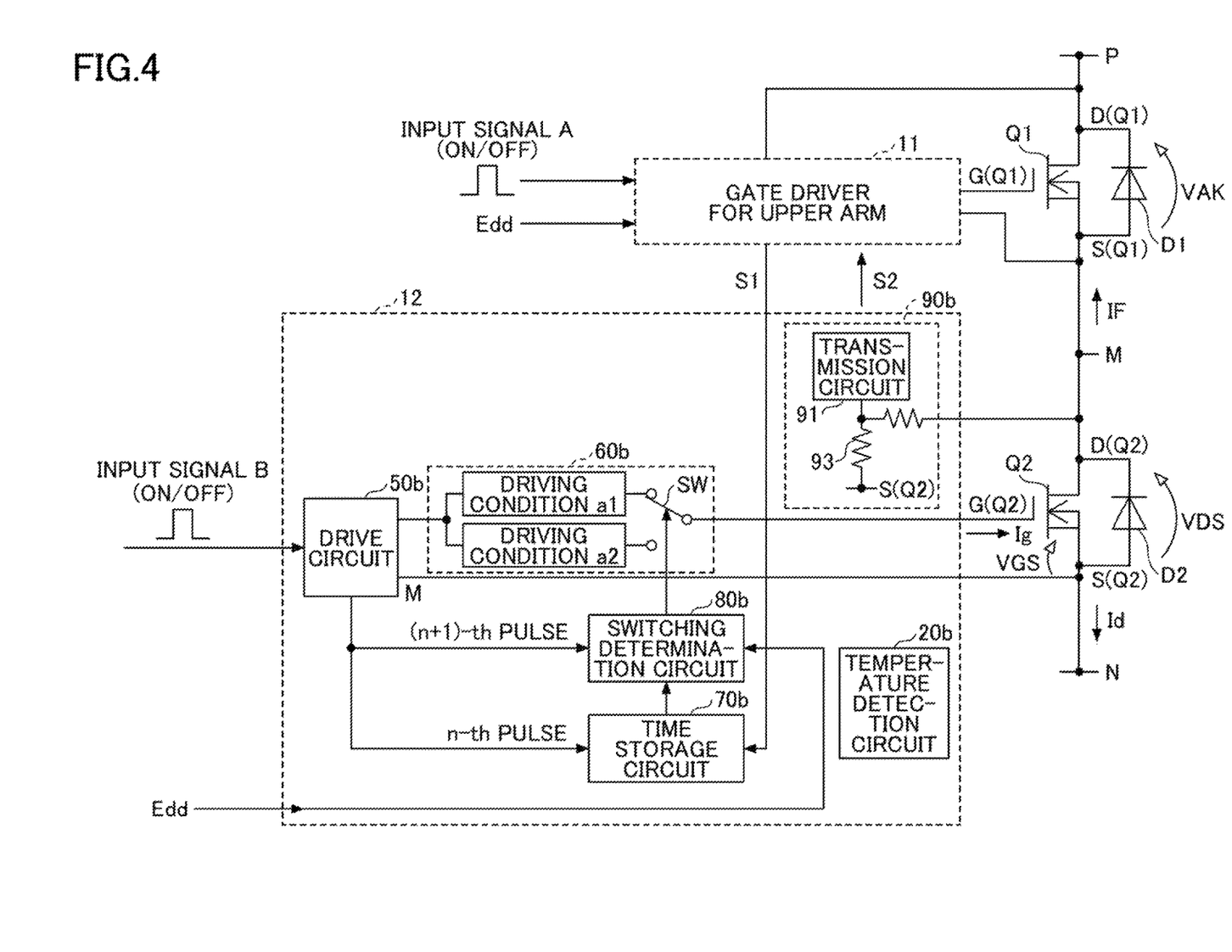
FIG. 4 is a block diagram illustrating a configuration example of a gate driver.

FIG. 4 is a diagram illustrating a configuration example of gate drivers. The gate driver 11 for an upper arm is a drive circuit that turns on and off the gate of the switching element Q1 that is the upper arm. The gate driver 12 for a lower arm is a drive circuit that turns on and off the gate of the switching element Q2 that is the lower arm.

The gate driver 12 includes a drive circuit 50*b*, a surge detection circuit 90*b*, a time storage circuit 70*b*, a switching determination circuit 80*b*, and a driving condition change circuit 60*b*. Although not illustrated in FIG. 4, the gate driver 11 includes a drive circuit 50*a*, a surge detection circuit 90*a*, a time storage circuit 70*a*, a switching determination circuit 80*a*, and a driving condition change circuit 60*a*, similarly to the gate driver 12.

The drive circuit 50*b* is a circuit part that drives the gate of the switching element Q2 in response to an input signal B from outside the gate driver 12. The input signal B is a signal that commands to switch on/off the switching element Q2, and is, for example, a pulse-width modulated signal (PWM signal). In a case in which the input signal B is a PWM signal, the input signal B at an active level (e.g., a high level) represents an on command for turning on the switching element Q2, and the input signal B at an inactive level (e.g., a low level) represents an off command for turning off the switching element Q2. The drive circuit 50*b* operates with the source S of the switching element Q2 as the ground reference.

The drive circuit 50*a* is a circuit part that drives the gate of the switching element Q1 in response to an input signal A from outside the gate driver 11. The input signal A is a signal that commands to switch on/off the switching element Q1, and is, for example, a pulse-width modulated signal (PWM signal). In a case in which the input signal A is a PWM signal, the input signal A at an active level (e.g., a high level) represents an on command for turning on the switching element Q1, and the input signal A at an inactive level (e.g., a low level) represents an off command for turning off the switching element Q1. The drive circuit 50*a* operates with the source S of the switching element Q1 as the ground reference.

The input signal A is a signal complementary to the input signal B. During a period in which the input signal A is at the active level, the input signal B is at the inactive level, and during a period in which the input signal B is at the active level, the input signal A is at the inactive level.

The surge detection circuit 90*b* detects a recovery surge voltage that is generated between the anode and the cathode of the diode D2 at the time of turn-on of the switching element Q1 that is opposite to the switching element Q2. A voltage that is generated, between the drain D and the source S of the switching element Q2 (between the anode and the cathode of the diode D2), higher than the power supply voltage Ed at the time of turn-on of the switching element Q1 is referred to as a recovery surge voltage that is generated by the diode D2 that is opposite to the switching element Q1. In a case of detecting a recovery surge voltage that is generated by the diode D2, the surge detection circuit 90*b* outputs a detection signal S2 representing that the recovery surge voltage generated by the diode D2 due to turn-on of the switching element Q2 is detected.

The surge detection circuit 90*a* detects a recovery surge voltage that is generated between the anode and the cathode of the diode D1 at the time of turn-on of the switching element Q2 that is opposite to the switching element Q1. A voltage that is generated, between the drain D and the source S of the switching element Q1 (between the anode and the cathode of the diode D1), higher than the power supply voltage Ed at the time of turn-on of the switching element Q2 is referred to as a recovery surge voltage that is generated by the diode D1 that is opposite to the switching element Q2. In a case of detecting a recovery surge voltage that is generated by the diode D1, the surge detection circuit 90*a* outputs a detection signal S1 representing that the recovery surge voltage generated by the diode D1 due to turn-on of the switching element Q2 is detected.

The surge detection circuit 90*b*, for example, observes a voltage VDS between the drain D and the source S of the switching element Q2. In a case in which a voltage VDS exceeding a set voltage value Va has been observed, the surge detection circuit 90*b* outputs, to the gate driver 11, a detection signal S2 representing that the recovery surge voltage generated by the diode D2 due to turn-on of the switching element Q1 is detected. The surge detection circuit 90*a*, for example, observes a voltage VDS between the drain D and the source S of the switching element Q1. In a case in which a voltage VDS exceeding a set voltage value Va has been observed, the surge detection circuit 90*a* outputs, to the gate driver 12, a detection signal S1 representing that the recovery surge voltage generated by the diode D1 due to turn-on of the switching element Q2 is detected.

The set voltage value Va is set in advance to be a value that is greater than the voltage value of the power supply voltage Ed and that is less than the maximum value (peak value Vp) of the recovery surge voltage that may occur by design. For example, the peak value Vp of the recovery surge voltage is a voltage value of the voltage VDS that is generated, when a first switching element is turned on at the maximum value Ed(max) of the power supply voltage Ed, at both ends of a second switching element that is opposite to the first switching element. By detecting whether or not the voltage VDS exceeds the set voltage value Va, the surge detection circuits 90a and 90b can detect an occurrence of a recovery surge voltage at an intermediate stage before the recovery surge voltage reaches the peak value Vp.

Using that the input signal B is complementary to the input signal A, for example, the surge detection circuit 90b determines whether a voltage VDS exceeding the set voltage value Va at the switching element Q2 is a recovery surge voltage that is generated by the diode D2 due to turn-on of the switching element Q1. Because the input signal B is complementary to the input signal A, the input signal A is switched to the on command after the input signal B is switched to the off command. Accordingly, the surge detection circuit 90b can detect a voltage VDS exceeding the set voltage value Va after the input signal B is switched to the off command, as a recovery surge voltage that is generated by the diode D2 due to turn-on of the switching element Q1.

Also, the surge detection circuit 90b may detect a voltage VDS exceeding the set voltage value Va after obtaining the input signal A and after the obtained input signal A is switched to the on command, as a recovery surge voltage that is generated by the diode D2 due to turn-on of the switching element Q1. The surge detection circuit 90b may obtain a gate driving signal of the switching element Q1 instead of obtaining the input signal A. In this case, the surge detection circuit 90b detects the voltage VDS exceeding the set voltage value Va after the obtained gate driving signal is switched to on-driving, as the recovery surge voltage that is generated by the diode D2 due to turn-on of the switching element Q1.

Similarly, using that the input signal A is complementary to the input signal B, for example, the surge detection circuit 90a determines whether a voltage VDS exceeding the set voltage value Va at the switching element Q1 is a recovery surge voltage that is generated by the diode D1 due to turn-on of the switching element Q2. Because the input signal A is complementary to the input signal B, the input signal B is switched to the on command after the input signal A is switched to the off command. Accordingly, the surge detection circuit 90a can detect a voltage VDS exceeding the set voltage value Va after the input signal A is switched to the off command, as a recovery surge voltage that is generated by the diode D1 due to turn-on of the switching element Q2.

Also, the surge detection circuit 90a may detect a voltage VDS exceeding the set voltage value Va after obtaining the input signal B and after the obtained input signal B is switched to an on command, as a recovery surge voltage that is generated by the diode D1 due to turn-on of the switching element Q2. The surge detection circuit 90a may obtain a gate driving signal of the switching element Q2 instead of obtaining the input signal B. In this case, the surge detection circuit 90a detects the voltage VDS exceeding the set voltage value Va after the obtained gate driving signal is switched to on-driving, as the recovery surge voltage that is generated by the diode D1 due to turn-on of the switching element Q2.

The surge detection circuit 90b includes, for example, a voltage divider circuit for dividing a voltage VDS by resistors 92 and 93 and a transmission circuit 91 that outputs a detection signal S2 to the gate driver 11 in a case in which the voltage VDS exceeding the set voltage value Va is observed based on a voltage value obtained by dividing the voltage VDS. The transmission circuit 91 outputs a detection signal S2 to the gate driver 11 through an isolated circuit by a magnetic circuit such as a coil, for example. Similarly to the surge detection circuit 90b, the surge detection circuit 90a may also include a transmission circuit 91 that outputs a detection signal S1 to the gate driver 12.

It should be noted that the surge detection circuits 90a and 90b may detect the recovery surge voltage by a method other than the method of observing that the voltage VDS exceeds the set voltage value Va.

For example, in a case in which it is observed that the change rate dV/dt of the voltage VAK of the diode D1 with respect to time has turned from positive to negative, the surge detection circuit 90a outputs to the gate driver 12 a detection signal S1 representing that the recovery surge voltage that is generated by the diode D1 due to turn-on of the switching element Q2 is detected. The voltage VAK of the diode D1 represents the forward voltage of the diode D1 or the voltage VDS of the switching element Q1. Similarly, in a case in which it is observed that the change rate dV/dt of the voltage VAK of the diode D2 with respect to time has turned from positive to negative, the surge detection circuit 90b outputs to the gate driver 11 a detection signal S2 representing that the recovery surge voltage that is generated by the diode D2 due to turn-on of the switching element Q1 is detected. The voltage VAK of the diode D2 represents the forward voltage of the diode D2 or the voltage VDS of the switching element Q2. In a case of observing the change rate of the voltage VAK of the diode with respect to time, similarly to the above described case of observing the voltage VDS, the surge detection circuits 90a and 90b may use an input signal or a gate signal in order to determine whether or not the observed value is a recovery surge voltage due to turn-on of the opposite arm.

The surge detection circuit 90b includes a transmission circuit 91 that outputs the detection signal S2 to the time storage circuit 70a of the gate driver 11. Similarly, the surge detection circuit 90a includes a transmission circuit 91 that outputs the detection signal S1 to the time storage circuit 70b of the gate driver 12.

The time storage circuit 70b stores a time length Δtb from when the input signal B is switched to an on command to when a recovery surge voltage that is generated by the diode D1 that is opposite to the switching element Q2 is detected. For example, the time storage circuit 70b stores the time length Δtb from an edge timing, at which the input signal B is switched from an on command to an off command, to a timing at which a detection signal S1 that is supplied from the surge detection circuit 90a of the gate driver 11 is input, by a counter or a filter. The time storage circuit 70b updates the time length Δtb for each turn-on of the switching element Q2 (i.e., each time the input signal B is switched to an on command).

The time storage circuit 70a stores a time length Δta from when the input signal A is switched to an on command to when a recovery surge voltage that is generated by the diode D2 that is opposite to the switching element Q1 is detected. For example, the time storage circuit 70a stores the time length Δta from an edge timing, at which the input signal A is switched from an on command to an off command, to a timing at which a detection signal S2 that is supplied from the surge detection circuit 90b of the gate driver 12 is input, by a counter or a filter. The time storage circuit 70a updates the time length Δta for each turn-on of the switching element Q1 (i.e., each time the input signal A is switched to an on command).

The switching determination circuit 80b determines, in accordance with the detected value Edd of the power supply voltage Ed, whether or not to switch a gate driving condition of the switching element Q2. For example, the switching determination circuit 80b determines to switch the gate driving condition in a case in which the detected value Edd is equal to a predetermined determination value Ed(ref) or greater than the determination value Ed(ref), and the switching determination circuit 80b determines not to switch the gate driving condition in a case in which the detected value Edd is smaller than the determination value Ed(ref). The determination value Ed(ref) is set to a voltage value (=Ed(max)−α) between the maximum value Ed(max) that the power supply voltage Ed can take and the minimum value Ed(min) that the power supply voltage Ed can take. α is a non-negative value. Similarly to the switching determination circuit 80b, the switching determination circuit 80a also determines whether or not to switch the gate driving condition of the switching element Q1 in accordance with the detected value Edd of the power supply voltage Ed.

The switching determination circuit 80b designates, in accordance with the determination result of whether or not to switch the gate driving condition of the switching element Q2, a period (time length Δtb stored in the time storage circuit 70b) during which the driving condition change circuit 60b is caused to change the gate driving condition of the switching element Q2. The switching determination circuit 80a designates, in accordance with the determination result of whether or not to switch the gate driving condition of the switching element Q1, a period (time length Δta stored in the time storage circuit 70a) during which the driving condition change circuit 60a is caused to change the gate driving condition of the switching element Q1.

The driving condition change circuit 60b changes, in accordance with a determination result of the switching determination circuit 80b, the gate driving condition of the switching element Q2 at the time of current turn-on of the switching element Q2 by a time length that is the same as the time length Δtb stored at the time of previous turn-on in the time storage circuit 70b. The driving condition change circuit 60a changes, in accordance with a determination result of the switching determination circuit 80a, the gate driving condition of the switching element Q1 at the time of current turn-on of the switching element Q1 by a time length that is the same as the time length Δta stored at the time of previous turn-on in the time storage circuit 70a.

The driving condition change circuit 60b changes the gate driving condition of the switching element Q2 in a period that is designated by the switching determination circuit 80b (time length Δtb stored in the time storage circuit 70b). The driving condition change circuit 60a changes the gate driving condition of the switching element Q1 in a period that is designated by the switching determination circuit 80a (time length Δta stored in the time storage circuit 70a). Although the gate driving conditions a1 and a2 having different condition contents are exemplified as the gate driving conditions in FIG. 4, three or more driving conditions having different condition contents may be set.

The driving condition change circuit 60b selects one of the driving conditions a1 and a2 depending on the presence/absence of designation of a time length Δtb. For example, the driving condition change circuit 60b selects the driving conditions a2 in the time length Δtb designated by the switching determination circuit 80b and selects the driving conditions a1 in a time other than the time length Δtb designated by the switching determination circuit 80b. The driving condition change circuit 60a also selects one of the driving conditions a1 and a2, similarly to the driving condition change circuit 60b.

At the time of current turn-on, the driving condition change circuit 60b changes, by a time length that is the same as the time length Δtb stored at the time of previous turn-on in the time storage circuit 70b, the gate driving condition to a condition in which the turn-on speed of the switching element Q2 is slowed.

The driving condition change circuit 60b includes, for example, two gate resistors each having a different resistance value, and a switch circuit that switches whether to connect each gate resistor to the gate of the switching element Q2. The resistance value of the gate resistor that is connected to the gate of the switching element Q2 in a case in which the driving condition a1 is selected is smaller than that in a case in which the driving condition a2 is selected.

Accordingly, during turn-on of the switching element Q2 by the drive circuit 50b, by selecting the driving condition a2 in which the resistance value of the gate resistor is increased, the switching speed (turn-on speed) of the switching element Q2 is slowed. Therefore, a change rate (dI/dt) of drain current flowing through the switching element Q2 with respect to time decreases, and recovery surge voltage that is generated by the diode D1 due to turn-on of the switching element Q2 can be suppressed. On the other hand, during turn-on of the switching element Q2 by the drive circuit 50b, by selecting the driving condition a1 in which the resistance value of the gate resistor is decreased, the switching speed (turn-on speed) of the switching element Q2 increases. Therefore, switching losses at the time of turn-on can be reduced.

The driving condition change circuit 60b may also be configured to include two gate current sources each having a different current value and a switch circuit that switches whether to connect each gate current source to the gate of the switching element Q2. The current value of the gate current source connected to the gate of the switching element Q2 in a case in which the driving condition a1 is selected is greater than that in a case in which the driving condition a2 is selected. Alternatively, the driving condition change circuit 60b may also be configured to include two gate voltage sources each having a different voltage value and a switch circuit that switches whether to connect each gate voltage source to the gate of the switching element Q2. The voltage value of the gate voltage source, which is connected to the gate of the switching element Q2, in a case in which the driving condition a1 is selected is greater than that in a case in which the driving condition a2 is selected.

Accordingly, during turn-on of the switching element Q2 by the drive circuit 50b, by selecting the driving condition a2 in which the current value of the gate current source is decreased, the switching speed (turn-on speed) of the switching element Q2 is slowed. Therefore, during turn-on of the switching element Q2 by the drive circuit 50b, by selecting the driving condition a2 in which the current value of the gate current source or the voltage value of the gate voltage source is decreased, a change rate (dI/dt) of drain current flowing through the switching element Q2 with respect to time decreases. As a result, the recovery surge voltage that is generated by the diode D1 due to turn-on of the switching element Q2 can be suppressed. On the other hand, during turn-on of the switching element Q2 by the drive circuit 50b, by selecting the driving condition a1 in which current value of the gate current source is increased, the switching speed (turn-on speed) of the switching element Q2 increases. Therefore, during turn-on of the switching element Q2 by the drive circuit 50b, by selecting the driving condition a1 in which the current value of the gate current source or the voltage value of the gate voltage source is increased, switching losses at the time of turn-on can be reduced.

The switching determination circuit 80b determines, in accordance with the detected value Edd of the power supply voltage Ed, whether or not to switch the gate driving condition of the switching element Q2. The driving condition change circuit 60b changes, in accordance with a determination result of the switching determination circuit 80b, the gate driving condition at the time of current turn-off by a time length that is the same as the time length Δtb stored at the time of previous turn-on in the time storage circuit 70b. Therefore, because the gate driving condition is changed or not in accordance with the magnitude of the power supply voltage Ed, it is possible to both suppress the recovery surge voltage and reduce the switching losses even when the power supply voltage Ed varies.

For example, in a situation in which the recovery surge voltage that is generated by turn-on of the switching element is relatively low due to a decrease in the power supply voltage Ed, it is possible to prohibit switching to a gate driving condition in which the turn-on speed of the switching element is slowed. Therefore, in a situation in which the recovery surge voltage decreases due to a decrease in the power supply voltage Ed, it is possible to suppress an increase in turn-on losses due to the change rate dI/dt of the drain current with respect to time at the time of turn-on becoming gradual.

Similarly, for the driving condition change circuit 60a, during turn-on of the switching element Q1 by the drive circuit 50a, by selecting the driving condition a2, the change rate (dI/dt) of drain current flowing through the switching element Q1 with respect to time decreases. As a result, the recovery surge voltage that is generated by the diode D2 due to turn-on of the switching element Q1 can be suppressed. On the other hand, during turn-on of the switching element Q1 by the drive circuit 50a, by selecting the driving condition a1, the driving condition change circuit 60a can reduce switching losses at the time of turn-on. Also, the switching determination circuit 80a determines, in accordance with the detected value Edd of the power supply voltage Ed, whether or not to switch the gate driving condition of the switching element Q1. The driving condition change circuit 60a changes, in accordance with a determination result of the switching determination circuit 80a, the gate driving condition of the switching element Q1 at the time of current turn-on by a time length that is the same as the time length Δta stored at the time of previous turn-on in the time storage circuit 70a. Thereby, because it is possible to switch whether or not to change the gate driving condition in accordance with the magnitude of the power supply voltage Ed, it is possible to achieve both suppression of recovery surge voltage and reduction of switching losses even when the power supply voltage Ed varies.

Next, with reference to FIGS. 4, 5, and 6, differences in operations of the gate driver depending on magnitude of the power supply voltage Ed will be described.

Figure 5:
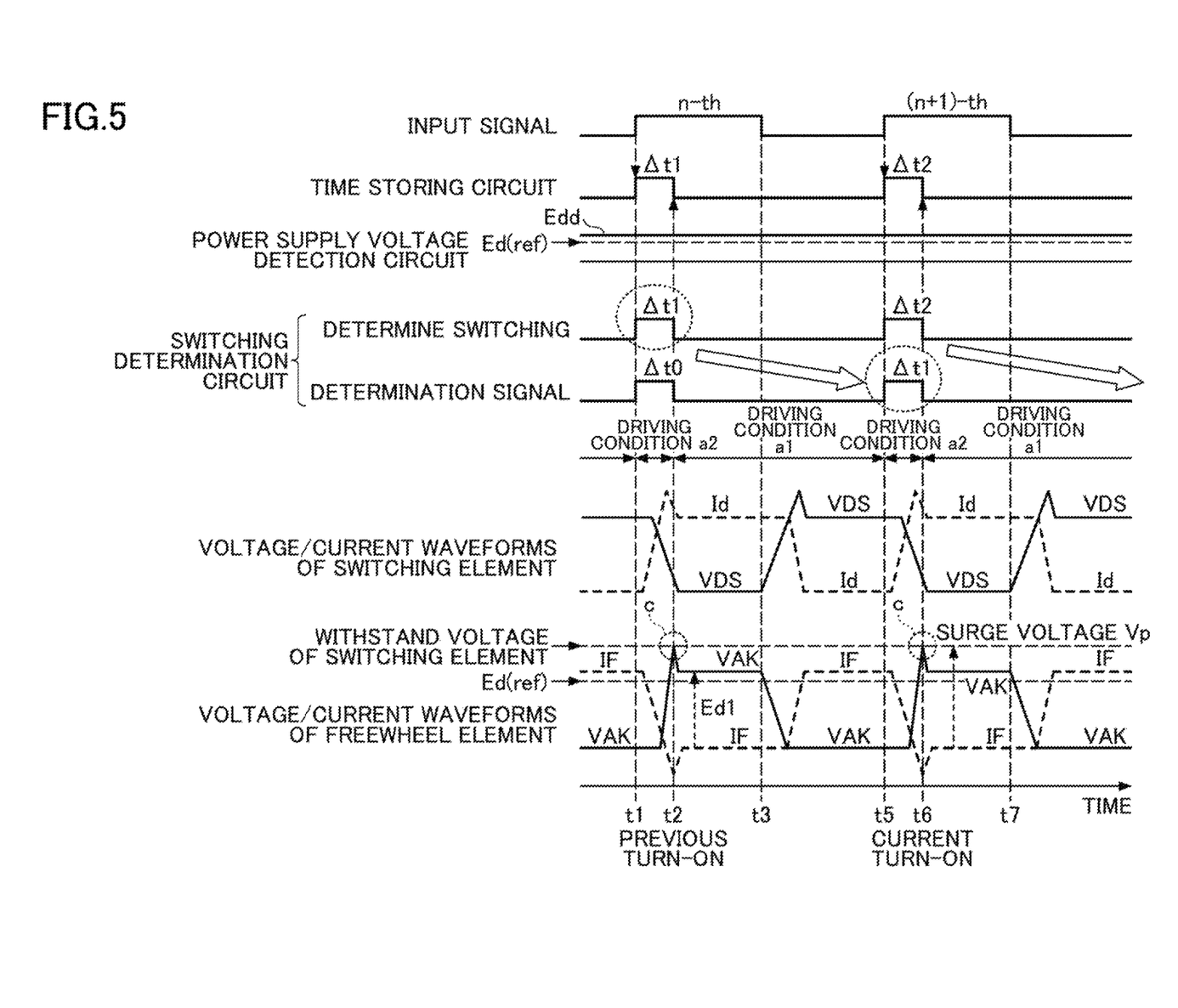
FIG. 5 is a timing chart illustrating an example of an operation of the gate driver in a case in which power supply voltage is high.

FIG. 5 is a timing chart illustrating an example of the operation of the gate driver 12 when the detected value Edd of the power supply voltage Ed is equal to or greater than the determination value Ed(ref) (more specifically, when the power supply voltage Ed is at the maximum value Ed(max)). The description of the operation example of the gate driver 11 is omitted by applying the description of the operation example of the gate driver 12.

In accordance with an input signal B that switches the switching element Q2, the drive circuit 50b supplies a control signal (gate driving signal) to a control terminal (gate) of the switching element Q2 through the driving condition change circuit 60b. In this example, a high level input signal B represents an on command of the switching element Q2, and a low level input signal B represents an off command of the switching element Q2.

In a case in which the input signal B is changed from the off command to the on command, the switching element Q2 starts turning on in accordance with the control signal input to the control terminal (at time point t1). Drain-source voltage VDS of the switching element Q2 starts decreasing, and drain current Id starts increasing.

At the same time when the input signal B changes to the on command, the time storage circuit 70b starts measuring the time length Δtb. For example, after the input signal B becomes the on command, the time storage circuit 70b starts to count, from a count start value set in advance, and converts the time length Δtb into a numerical value or a voltage value.

Upon starting turn-on of the switching element Q2 and the surge detection circuit 90a of the gate driver 11 detecting a recovery surge voltage that is generated at the diode D1, a detection signal S1 representing the detection of the recovery surge voltage is output to the time storage circuit 70b of the gate driver 12.

At the same time when the detection signal S1 supplied from the surge detection circuit 90a is input, the time storage circuit 70b stops counting, stores the measured value Δt1 of the time length Δtb at the time of n-th turn-on, and outputs a signal representing the measured value Δt1 to the switching determination circuit 80b. Each time the switching element Q2 is turned on, the time storage circuit 70b stores the time length Δtb at the time of its turn-on, and outputs a signal representing the measured value of the time length Δtb to the switching determination circuit 80b.

Because the current detected value Edd of the power supply voltage Ed is greater than the determination value Ed(ref), the switching determination circuit 80b determines to switch the gate driving condition. The switching determination circuit 80b designates the driving condition a2 from the time point t1 at which the input signal B changes from the off command to the on command to the time point t2 at which the measured value Δt0 of time length Δtb elapses. The measured value Δt0 corresponds to the measured value of time length Δtb at the time of the (n−1)-th turn-on obtained by time storage circuit 70b.

That is, the gate driving condition switches to the driving condition a2 from the time point t1 when the turn-on operation is started to the time point t2. Because the driving condition a2 is a condition in which the turn-on speed is made slower than that of the driving condition a1, the switching speed during the first half of the turn-on period is slowed down and the recovery surge voltage that is generated by the diode D1 is suppressed (refer to circles c).

However, after the elapse of the measured value Δt0 of the time length Δtb, the driving condition change circuit 60b returns the gate driving condition to the driving condition a1 before the change. This increases the switching speed during the second half of the turn-on period and reduces the switching losses.

The drive circuit 50b starts turning off the switching element Q2 at the timing t3 at which the input signal B switches from the on command to the off command.

Timings t5 to t7 at the (n+1)-th switching correspond to timings t1 to t3 at the n-th switching described above. That is, the switching determination circuit 80b designates the driving condition a2 from the time point t5 at which the input signal B changes from the off command to the on command to the time point t6 at which the measured value Δt1 of time length Δtb elapses. The measured value Δt1 corresponds to the measured value of the time length Δtb at the time of n-th turn-on obtained by the time storage circuit 70b. The timing t7 corresponds to the timing at which the input signal B changes from the on command to the off command.

Figure 6:
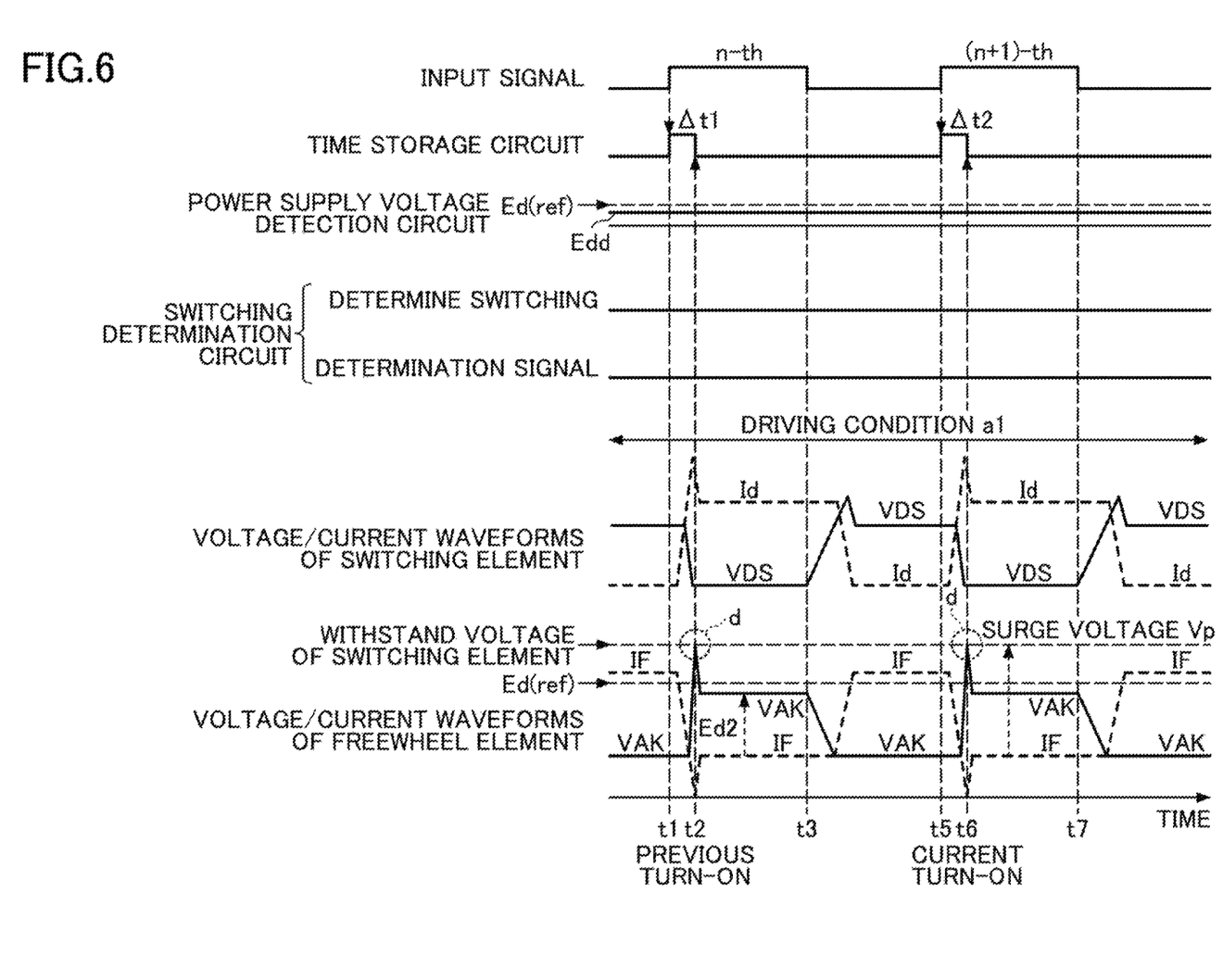
FIG. 6 is a timing chart illustrating an example of an operation of the gate driver in a case in which power supply voltage is low.

On the other hand, FIG. 6 is a timing chart illustrating an example of the operation of the gate driver 12 when the detected value Edd of the power supply voltage Ed is less than the determination value Ed(ref) (more specifically, when the power supply voltage Ed is at the minimum value Ed (min)). The description of the operation example of the gate driver 11 is omitted by applying the description of the operation example of the gate driver 12.

In this case, because the current detected value Edd of the power supply voltage Ed is smaller than the determination value Ed(ref), the switching determination circuit 80b determines not to switch the gate driving condition. The switching determination circuit 80b does not designate the driving condition a2 at the timing t1. Accordingly, the gate driving condition during the turn-on is maintained at the driving condition a1 without switching to the driving condition a2. Therefore, it is possible to prevent an increase in turn-on losses due to a speed reduction of the switching speed. Also, even when the recovery surge voltage is not actively suppressed by a speed reduction of the switching speed (refer to circles d), the recovery surge voltage that is generated by the diode D1 due to a decrease in the power supply voltage Ed does not become so high. Therefore, the recovery surge voltage that is generated by the diode D1 does not exceed the withstand voltage of the switching element Q1.

That is, in a situation in which the recovery surge voltage that is generated by the diode D1 due to a decrease in the power supply voltage Ed is relatively low, it is possible to prohibit switching to a gate driving condition in which the turn-on speed of the switching element Q2 is slowed. Therefore, in a situation in which the recovery surge voltage decreases due to a decrease in the power supply voltage Ed, it is possible to suppress an increase in turn-on losses due to the change rate dI/dt of the drain current with respect to time at the time of turn-on becoming gradual. In this manner, according to the present disclosure, it is possible to achieve both suppression of recovery surge voltage and reduction of switching losses even when the power supply voltage Ed varies.

Here, because the magnitude of the recovery surge voltage varies in accordance with the temperature of the diode, the switching determination circuit 80b may change the determination value Ed(ref) in accordance with the temperature of the diode D1 (which may include the ambient temperature of the diode D1). Thereby, because it is possible to switch whether or not to change the gate driving condition in accordance with the temperature of the diode D1, it is possible to maintain achieving both suppression of recovery surge voltage and reduction of switching losses even when the temperature of the diode D1 varies. In a case in which the determination value Ed(ref) is defined with "Ed(max)–α", the switching determination circuit 80b changes the determination value Ed(ref) by changing α. The switching determination circuit 80a may also change the determination value Ed(ref) according to the temperature of the diode D2 (which may include the ambient temperature of the diode D2) similarly to the switching determination circuit 80b.

For example, as illustrated in FIG. 4, the gate driver 12 includes a temperature detection circuit 20b that detects the temperature of the diode D2, and the gate driver 11 includes a temperature detection circuit 20a (not illustrated) that detects the temperature of the diode D1. The temperature detection circuit 20a detects the temperature of the diode D1 by causing a constant current to flow through a diode provided near the diode D1 and measuring the forward voltage of the provided diode. The temperature detection circuit 20a may detect the temperature of the diode D1 in another detection method. The temperature detection circuit 20b also detects the temperature of the diode D2, similarly to the temperature detection circuit 20a. The switching determination circuit 80b changes the determination value Ed(ref) in accordance with the temperature that is detected by the temperature detection circuit 20a. The switching determination circuit 80a changes the determination value Ed(ref) in accordance with the temperature that is detected by the temperature detection circuit 20b.

A diode has a property such that as the temperature of the diode decreases, the recovery surge voltage decreases. In consideration of this property, in a case in which the temperature of the diode D1 detected by the temperature detection circuit 20a is low, the switching determination circuit 80b may increase the determination value Ed(ref) in comparison to that in a case in which the temperature of the diode D1 is high. Thus, for example, in a situation in which the recovery surge voltage that is generated by the diode D1 is relatively low due to a decrease in the temperature of the diode D1, it is possible to prohibit switching to a gate driving condition in which the turn-on speed of the switching element Q2 is slowed. Accordingly, in a situation in which the recovery surge voltage decreases due to a decrease in the temperature of the diode D1, it is possible to suppress an increase in turn-on losses due to the change rate dI/dt of the drain current with respect to time at the time of turn-on becoming gradual. In a case in which the determination value Ed(ref) is defined with "Ed(max)–α", the switching determination circuit 80b can increase the determination value Ed(ref) by decreasing α. Similarly to the switching determination circuit 80b, in a case in which the temperature of the diode D2 detected by the temperature detection circuit 20b is low, the switching determination circuit 80a may increase the determination value Ed(ref) in comparison to that in a case in which the temperature of the diode D2 is high.

Although the gate driver and the power converter have been described with reference to the embodiment, the present invention is not limited to the embodiment described above. Various modifications and enhancements, such as combinations and substitutions with some or all of the other embodiments, are possible within the scope of the present invention.

For example, a power converter including at least one gate driver is not limited to a DC-DC converter that converts direct current to another direct current. Specific examples of the power converter include an inverter for converting direct current to alternating current, a step-up converter for increasing an input voltage and outputting the increased voltage, a step-down converter for decreasing an input voltage and outputting the decreased voltage, and a buck-boost converter for increasing or decreasing an input voltage and outputting the increased or decreased voltage.

Also, the surge detection circuits 90a and 90b may detect the recovery surge voltage by a method other than the method of observing the voltage VDS or the voltage VAK.

For example, in a case in which it is observed that the change rate dI/dt of the drain current I of the switching element Q2 with respect to time has turned from positive to negative, the surge detection circuit 90b may output to the time storage circuit 70b a detection signal S1 representing that the recovery surge voltage that is generated by the diode D1 due to turn-on of the switching element Q2 is detected. Similarly, in a case in which it is observed that the change rate dI/dt of the drain current I of the switching element Q1 with respect to time has turned from positive to negative, the surge detection circuit 90a may output to the time storage circuit 70a a detection signal S2 representing that the recovery surge voltage that is generated by the diode D2 due to turn-on of the switching element Q1 is detected.

What is claimed is:

1. A gate driver comprising:
 a drive circuit configured to drive, in accordance with an input signal that commands to turn on/off a switching element that is connected between a high power supply potential part and a low power supply potential part, a gate of the switching element;
 a time storage circuit configured to store a time length from when the input signal is switched to an on command to when a recovery surge voltage that is generated by a diode that is opposite to the switching element is detected;
 a switching determination circuit configured to determine, in accordance with a detected value of a power supply voltage between the high power supply potential part and the low power supply potential part, whether or not to switch a gate driving condition of the switching element; and
 a driving condition change circuit configured to change, in accordance with a determination result of the switching determination circuit, the gate driving condition at a time of current turn-on by a time length that is the same as the time length stored at a time of previous turn-on in the time storage circuit.

2. The gate driver according to claim 1, wherein the switching determination circuit is configured to determine to switch the gate driving condition in a case in which the detected value of the power supply voltage is greater than a determination value and is configured to determine not to switch the gate driving condition in a case in which the detected value of the power supply voltage is less than the determination value.

3. The gate driver according to claim 2, wherein the switching determination circuit is configured to change the determination value in accordance with a temperature of the diode.

4. The gate driver according to claim 3, wherein, in a case in which the temperature is low, the switching determination circuit is configured to increase the determination value in comparison to that in a case in which the temperature is high.

5. The gate driver according to claim 1, wherein at the time of current turn-on, the driving condition change circuit is configured to change, by a time length that is the same as the time length stored at the time of previous turn-on in the time storage circuit, the gate driving condition to a condition in which a turn-on speed of the switching element is slowed.

6. The gate driver according to claim 5, wherein the driving condition change circuit is configured to slow down the turn-on speed by increasing a resistance value of a gate resistor that is connected to the gate of the switching element.

7. The gate driver according to claim 5, wherein the driving condition change circuit is configured to slow down the turn-on speed by reducing a current value of a gate current that flows through the gate of the switching element.

8. The gate driver according to claim 5, wherein, after an elapse of the same time length after changing the gate driving condition to the condition in which the turn-on speed of the switching element is slowed, the driving condition change circuit is configured to return the condition to the driving condition before change.

9. A power converter comprising:
 a plurality of switching elements that are connected in series between a high power supply potential part and a low power supply potential part;
 a plurality of gate drives provided for the plurality of respective switching elements and each of which is configured to drive a gate of a corresponding one switching element of the plurality of switching elements; and
 a power supply voltage detection circuit configured to detect a power supply voltage between the high power supply potential part and the low power supply potential part;
 each of the plurality of gate drives includes:
  a drive circuit configured to drive, in accordance with an input signal that commands to turn on/off the corresponding one switching element, the gate of the corresponding one switching element;
  a time storage circuit configured to store a time length from when the input signal is switched to an on command to when a recovery surge voltage that is generated by a diode that is opposite to the corresponding one switching element is detected;
  a switching determination circuit configured to determine, in accordance with the power supply voltage detected by the power supply voltage detection circuit, whether or not to switch a gate driving condition of the corresponding one switching element; and
  a driving condition change circuit configured to change, in accordance with a determination result of the switching determination circuit, the gate driving condition at a time of current turn-on by a time length that is the same as the time length stored at a time of previous turn-on in the time storage circuit.

10. The power converter according to claim 9, wherein the power supply voltage detection circuit includes:
 a voltage divider circuit configured to divide the power supply voltage; and
 an isolation amplifier to which the voltage divided by the voltage divider circuit is input and configured to output a detected value of the power supply voltage.

11. The power converter according to claim 9, wherein the plurality of switching elements are wide-bandgap devices.

* * * * *